United States Patent
Teysseyre et al.

(10) Patent No.: US 8,987,871 B2
(45) Date of Patent: Mar. 24, 2015

(54) CAP FOR A MICROELECTROMECHANICAL SYSTEM DEVICE WITH ELECTROMAGNETIC SHIELDING, AND METHOD OF MANUFACTURE

(75) Inventors: Jerome Teysseyre, Singapore (SG); Glenn de los Reyes, Singapore (SG); Wee Chin Judy Lim, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 373 days.

(21) Appl. No.: 13/485,631

(22) Filed: May 31, 2012

(65) Prior Publication Data

US 2013/0322039 A1   Dec. 5, 2013

(51) Int. Cl.
*H01L 23/60* (2006.01)
*H05K 9/00* (2006.01)

(52) U.S. Cl.
CPC .................................. *H05K 9/003* (2013.01)
USPC ............... 257/659; 257/E23.114; 438/121

(58) Field of Classification Search
CPC ........................ B81B 7/0032–7/0077
USPC ...................... 257/659, E23.114; 438/121
See application file for complete search history.

(56) References Cited

U.S. PATENT DOCUMENTS

| | | | |
|---|---|---|---|
| 6,531,232 B1 * | 3/2003 | Baleras et al. | 428/594 |
| 6,781,231 B2 * | 8/2004 | Minervini | 257/704 |
| 8,354,747 B1 * | 1/2013 | Kuo | 257/704 |
| 2002/0056898 A1 * | 5/2002 | Lopes et al. | 257/682 |
| 2002/0071940 A1 * | 6/2002 | Arnold et al. | 428/195 |
| 2004/0112529 A1 * | 6/2004 | Karlsson et al. | 156/306.6 |
| 2006/0001173 A1 * | 1/2006 | Yamano et al. | 257/774 |
| 2007/0025570 A1 * | 2/2007 | Yonehara et al. | 381/174 |
| 2008/0003492 A1 * | 1/2008 | Bates | 429/66 |
| 2008/0308912 A1 * | 12/2008 | Cha et al. | 257/659 |
| 2009/0218668 A1 * | 9/2009 | Zhe et al. | 257/680 |
| 2009/0256260 A1 * | 10/2009 | Nakamura | 257/758 |
| 2010/0308939 A1 * | 12/2010 | Kurs | 333/219.2 |
| 2011/0180885 A1 * | 7/2011 | Pahl et al. | 257/415 |
| 2011/0186943 A1 * | 8/2011 | Pahl et al. | 257/416 |
| 2012/0025356 A1 * | 2/2012 | Liao et al. | 257/659 |
| 2013/0105952 A1 * | 5/2013 | Fontana et al. | 257/659 |

* cited by examiner

*Primary Examiner* — Steven J Fulk
(74) *Attorney, Agent, or Firm* — Seed IP Law Group PLLC

(57) ABSTRACT

A cap for a microelectromechanical system device includes a first layer of, e.g., Bismaleimide Triazine (BT) resin material in which a through-aperture is formed, laminated to a second layer of BT resin material that closes the aperture in the first layer, forming a cavity. The first and second layers are laminated with a thermosetting adhesive that is sufficiently thick to encapsulate particles that may remain from a routing operation for forming the apertures. The interior of the cavity, including exposed portions of the adhesive, and the exposed face of the first layer are coated with an electrically conductive paint. The cap is adhered to a substrate over the MEMS device using an electrically conductive adhesive, which couples the conductive paint layer to a ground plane of the substrate. The layer of conductive paint serves as a shield to prevent or reduce electromagnetic interference acting on the MEMS device.

16 Claims, 4 Drawing Sheets

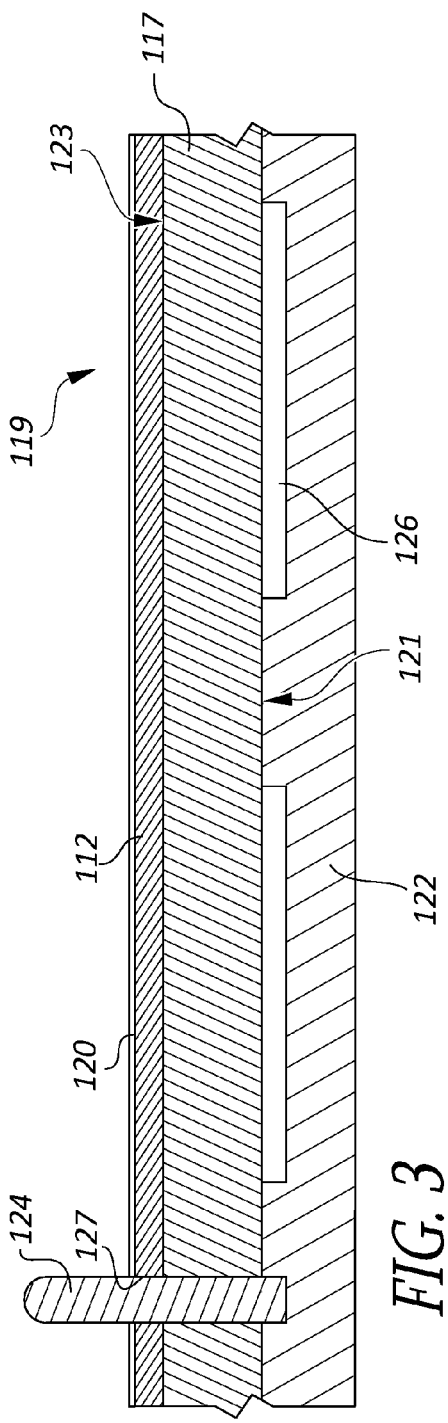
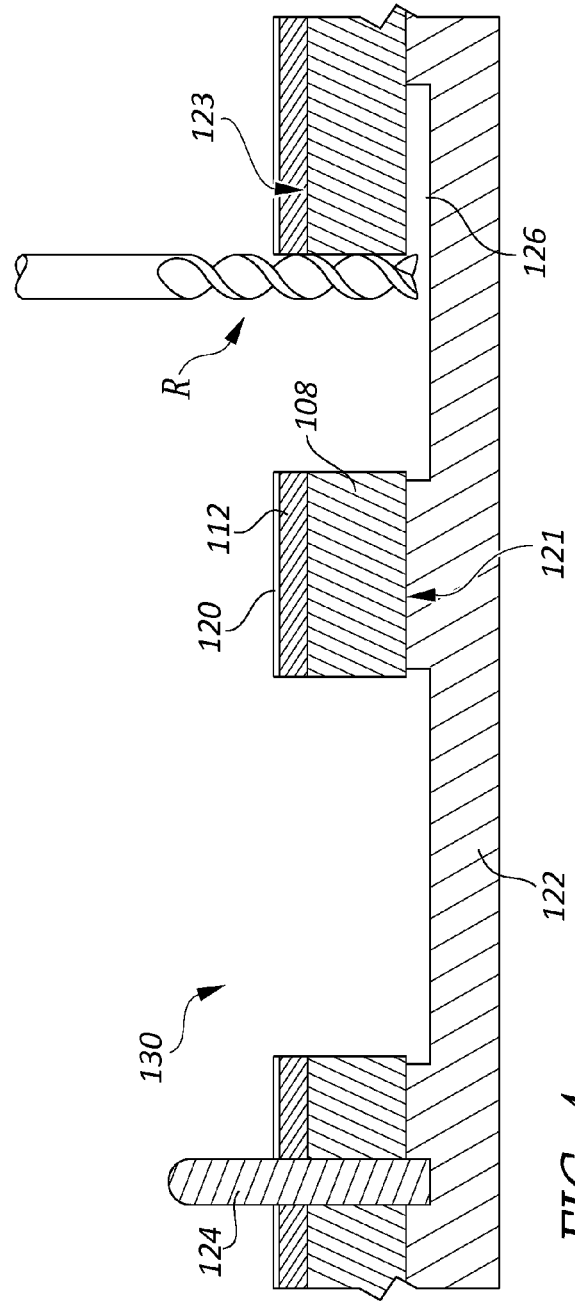

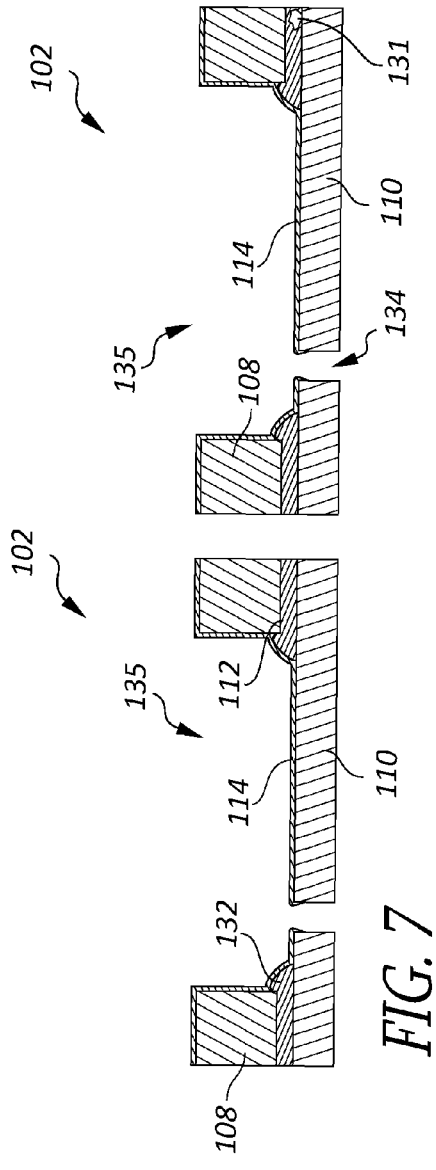
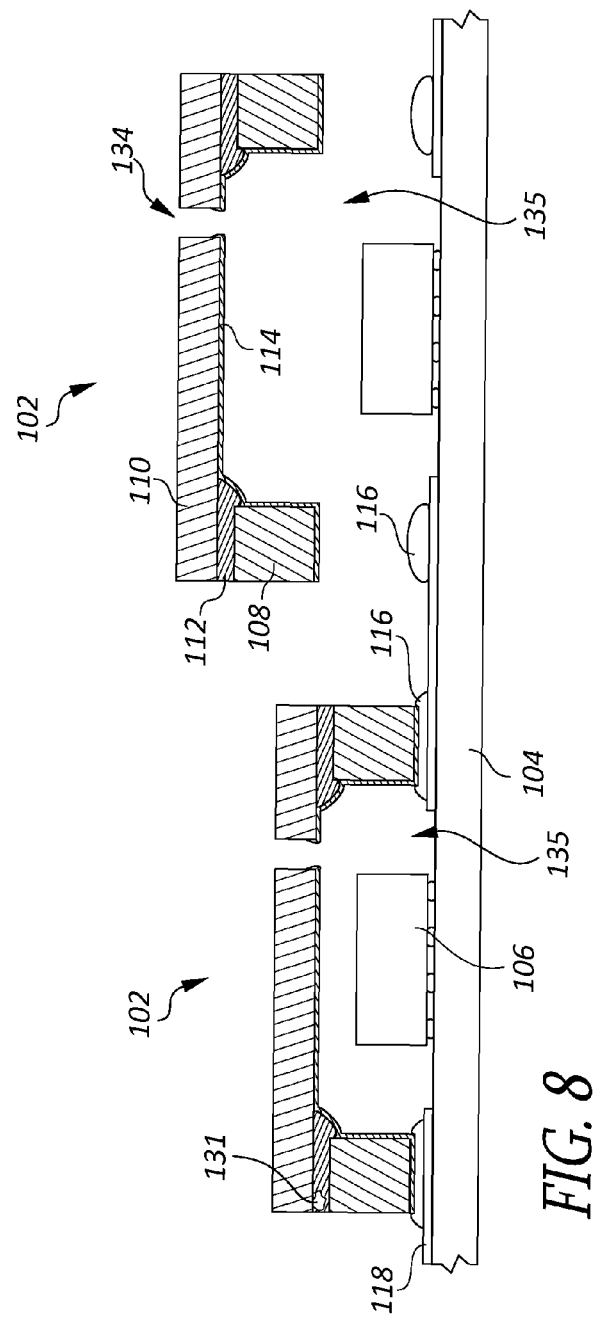

CAP FOR A MICROELECTROMECHANICAL SYSTEM DEVICE WITH ELECTROMAGNETIC SHIELDING, AND METHOD OF MANUFACTURE

BACKGROUND

1. Technical Field

Embodiments of the present invention are directed to an electromagnetic shielding structure, and in particular, to a structure configured to be mounted to a substrate over a microelectromechanical system device to shield the device from electromagnetic interference.

2. Description of the Related Art

Microelectromechanical systems (MEMS) are mechanical devices formed using processes originally developed for manufacturing integrated circuits and the like. In the last decade, MEMS devices have become increasingly more diverse and complex, finding use in more and more consumer and industrial applications. A partial list of MEMS devices in common use includes accelerometers, gyroscopes, inclinometers, optical switches, fluid pumps, biological testing devices, pressure sensors, motors for aligning read/write heads for hard drives, vehicle airbag triggers, microphones, thermometers, etc. As MEMS devices become more sophisticated and sensitive, in many cases they have become susceptible to electromagnetic interference (EMI) generated by nearby circuits or other sources. This is especially true for sensors of various types, such as, e.g., microphones. To protect such devices from EMI, shield caps are sometimes provided, which are placed over MEMS devices to intercept and shunt to ground EM radiation that might otherwise affect the effectiveness of the particular device.

FIG. 1 is a cross-sectional side view of a MEMS EMI shield cap 50 according to known art. Typically, the such devices are made from laminated sheets of Bismaleimide Triazine (BT). The shield cap 50 of FIG. 1 has a first BT layer 52 in which an aperture 60 is formed, and a second BT layer 54 that closes the aperture 60, forming a blind aperture, or cavity. The facing surfaces of the first and second layers 52, 54 have respective layers of copper foil 56, 58. A thin adhesive layer 62 bonds the facing surfaces together. The interior of the cavity 60 and the bottom surface of the first BT layer 52 (as oriented in FIG. 1) are plated in layers of copper 64, nickel 66, and gold 68.

A conductive adhesive is used on the bottom surface of the first layer 52 to mechanically couple the shield cap 50 over a MEMS device on a substrate, and electrically couple the conductive lining of the cap to a circuit ground. EM radiation cannot penetrate conductive plating in the shield cap, but is instead carried to ground by the device.

The shield cap 50 is manufactured as one of hundreds that are made in sheets or wafers then cut into individual caps. The manufacturing process includes depositing a seed layer of copper on the interior of the cavity 60 and the bottom surface of the first BT layer 52, then electroplating, in succession, copper, nickel, and gold layers 64, 66, 68.

The initial seed layer does not adhere to the adhesive layer 62 at A, but, provided the adhesive layer is sufficiently thin, the build-up of the copper layer 64 on the side wall surface 70 and back wall surface 72 of the cavity 60 will bridge the gap to form a continuous plated surface. This is important because if the plating on the back wall surface 72 is not electrically coupled to the plating on the side walls 70, EMI that strikes the back wall will not be shunted to ground, but will instead be reradiated inside the shield cap 50, which would, of course, defeat the purpose.

BRIEF SUMMARY

According to an embodiment, an electromagnetic interference (EMI) shield cap is provided, that includes a first layer of polymeric material, preferably Bismaleimide Triazine (BT), with an aperture extending through the first layer. A second layer of polymeric material is positioned on a first face of the first layer and covers an opening of the aperture so that the aperture forms a cavity in the combined layers, with side walls and a back wall. The first and second layers are joined by an adhesive positioned between the layers, and an electrically continuous layer of conductive paint covers the back and side walls of the cavity and exposed portions of the adhesive, and also covers the exposed face of the first layer.

According to an embodiment, a portion of the adhesive extends from between the first and second layers of polymeric material and forms a bead around the back wall of the cavity, which is also covered by the conductive paint.

BRIEF DESCRIPTION OF THE SEVERAL VIEWS OF THE DRAWINGS

FIGS. 3-8 are side cross-sectional views of showing respective stages in the manufacture of EMI shield caps and MEMS device packages according to the embodiment of FIG. 2, taken along lines 8-8 of FIG. 2.

DETAILED DESCRIPTION

Figure 1:
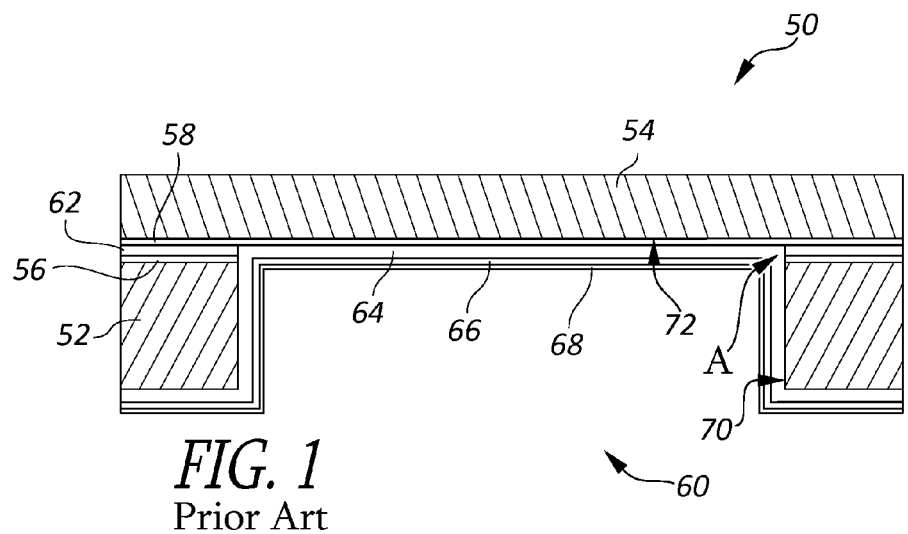
FIG. 1 is a cross-sectional side view of a MEMS electromagnetic interference (EMI) shield cap according to known art.

Referring again to the prior art shield cap 50 of FIG. 1, the inventors investigated a large number of product failures of electromagnetic interference (EMI) shield caps in which the adhesive joint 62 between the first and second Bismaleimide Triazine (BT) layers 52, 54 failed, permitting the second layer 54 to separate from the device. It was found that there were a number of contributory causes to the adhesive failure, including contamination between the adhesive 62 and the copper layer 58, and inadequate finishing of the surface of the copper layer 58. In both of these cases, the result was that the adhesive had not properly bonded with the copper layer 58 of the second BT layer 54.

It was first determined that it would cost prohibitive to clean the BT layers to a degree sufficient to eliminate all potential contamination before laminating the layers. During the manufacturing process, the adhesive layer 62 is applied to the layer of copper foil 56 of the first BT layer 52 before formation of the apertures 60. In this way, the adhesive layer 62 is automatically trimmed to size when the apertures 60 are made. However, the apertures 60 are formed by a router mechanism, which produces large quantities of tiny chips and fibers, many of which adhere to the edges of the adhesive layer 62, and are very difficult to remove or prevent. Additionally, the routing process can cause occasional delamination along the edges of the aperture 60 between internal layers, permitting the chips and fibers to penetrate. When a protective liner is removed from the adhesive 62 it tends to dislodge some of the chips from the edges of the adhesive, so that during the subsequent laminating process, some of the chips will inevitably be captured between the adhesive 62 and the copper foil layer 58 of the second BT layer 54. Because the adhesive layer 62 must be quite thin to enable the copper layer 64 to bridge the gap at A during plating, even very small chips can interfere with proper adhesion of the BT layers 52, 54.

Figure 2:
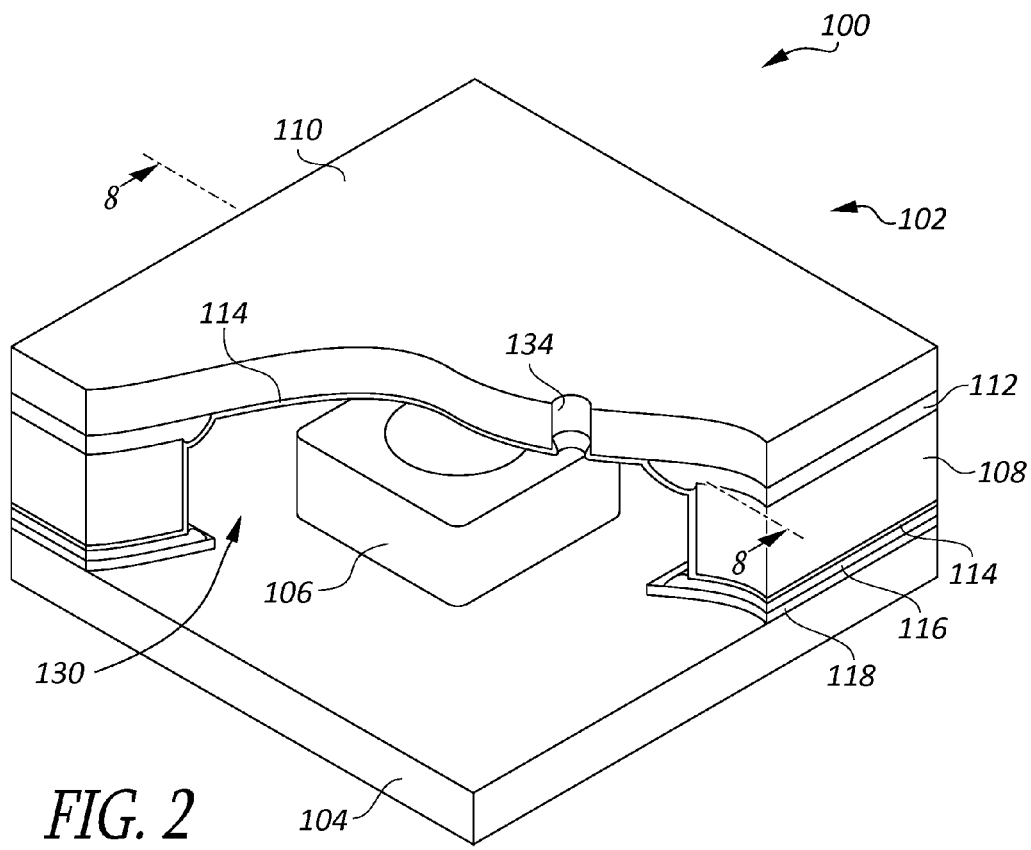
FIG. 2 is a perspective view of a MEMS device package that is partially cut away to show elements of an EMI shield cap 102, according to an embodiment.

FIG. 2 is a perspective view of a MEMS device package 100 that is partially cut away to show elements of an EMI shield cap 102, according to an embodiment. The package 100 includes a substrate 104 on which a MEMS microphone 106 is mounted and over which the EMI shield cap 102 is coupled. The substrate 104 can be any appropriate material such as, for example, BT, molding compound, polyamide resin, etc. A conductive land 18 on the substrate 104 surrounds the microphone 106, and is configured to be electrically coupled to a circuit ground. A conductive adhesive 116 couples the shield cap 102 to the conductive land 118.

The shield cap 102 includes a body comprising first and second BT layers 108, 110 coupled together by an adhesive layer 112. The shield cap 102 has a layer of conductive paint 114 lining the interior of a cavity 135 and extending over the bottom surfaces of the first BT layer 108. An aperture 134 is formed in the second BT layer 110 to permit proper operation of the MEMS microphone 106, according to well known principles.

A method of manufacturing the EMI shields cap 102 is described below with reference to the cross-sectional side views of FIGS. 3-8.

FIG. 3 shows a carrier substrate 122 with an alignment pin 124, which is one of a plurality of alignment pins coupled to the carrier substrate. Relief cavities 126 are provided in the carrier substrate to facilitate a later step in the process, as described below. A first BT sheet 117 is positioned on the carrier substrate 122 with a first face 121 in contact with the carrier substrate 122. The alignment pins 124 extend through corresponding alignment apertures 127 formed in the first BT sheet. The first BT sheet 117 has an adhesive film 112 positioned on a second face 123 of the first BT sheet 117. The adhesive film 112 includes an adhesive film layer 112 and a protective liner layer 120.

As shown in FIG. 4, apertures 130 are cut in the first BT sheet 117. In the process shown, the apertures 130 are cut in a router process, as indicated at R. The adhesive film 112 is cut during the same process, so that the apertures 130 extend through the adhesive film.

The relief cavities 126 formed in the carrier substrate 122 are in positions that correspond to the positions of the apertures 130, so that, as the cutting bit penetrates the BT sheet 117 and travels laterally to form an aperture 130, it does not contact the carrier substrate 122. Thus, the carrier substrate 122 is not modified by the routing process and can therefore be reused without requiring deburring or resurfacing, and no chips are produced of the material of the carrier substrate. Additionally, workload on the tip of the cutting bit is reduced, bearing in mind that, assuming equal work, the sharp points that define the corners of the cutting bit will become dull more quickly than the cutting edges that define the flutes of the cutting bit.

In the embodiment shown, a router process is employed to form the apertures 130 in the first BT sheet 117. However, this is by way of example, only. Many other alternative processes can be used. According to various embodiments, the apertures 130 can be formed by laser drilling, water jet cutting, die cutting, press punching, fine blanking, electron discharge machining, etc.

Figure 5:
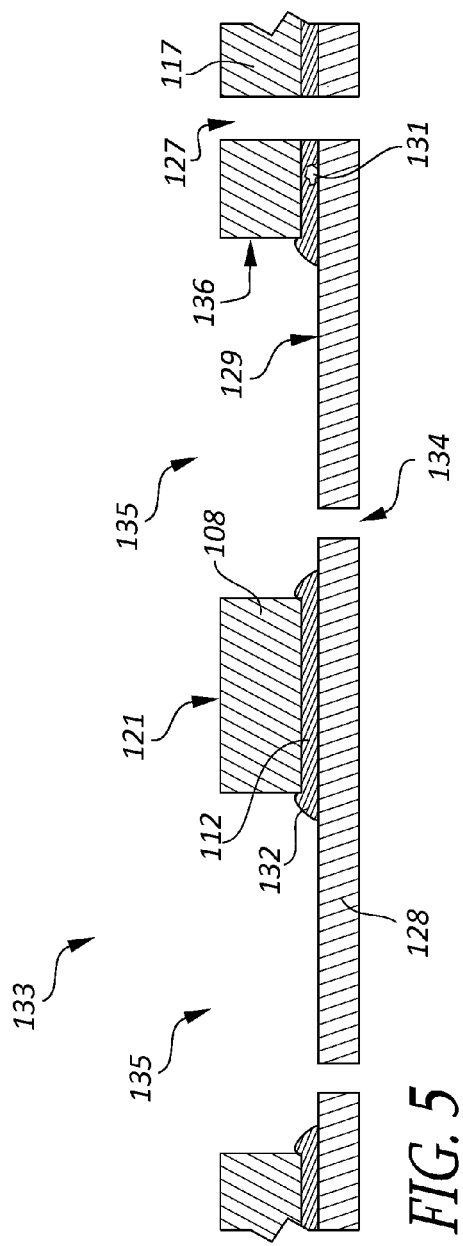

Following formation of the apertures 130, the protective liner layer 120 is removed from the adhesive film 119, exposing the adhesive film layer 112. The first BT sheet and a second BT sheet are aligned on alignment pins like the pin 124 of FIG. 3 in order to ensure that features of the second BT sheet 110, such as, e.g., apertures 134, are correctly positioned relative to the apertures 130 of the first BT sheet 117. Then, as shown in FIG. 5, the first BT sheet 117 is pressed together with the second BT sheet 128, with the adhesive film layer 112 pressed between the second face 123 of the first BT sheet and a first face 129 of the second BT sheet 128 to form an assembly 133 comprising the first and second BT sheets 117, 128 and the adhesive film layer 112. The second BT sheet 128 covers one end of the apertures 130 to produce corresponding cavities 135.

The term aperture is used herein to refer to a hole that extends through a piece of material so as to be open at two ends. The term cavity is used to refer to a hole that is closed at one end, such as is sometimes referred to as a blind aperture.

A chip 131 of BT material is shown trapped between the adhesive film layer 112 and the first face of the second BT sheet 128. As previously noted, completely removing all such chips following the routing process can be difficult, and in the case of EMI shield caps like that of FIG. 1, can interfere with full attachment of the BT layers, causing wastage. According to an embodiment, a thickness of the adhesive film layer 112 is selected to exceed the average dimensions of chips produced in the routing process. Additionally, increased pressure is employed in pressing the first and second BT sheets 117, 128 together so that the adhesive film layer 112 is forced into contact with the first face 129 of the second BT sheet 128, substantially encapsulating any chips that might be trapped. The increased compressive force also causes a portion of the adhesive film layer 112 to squeeze out from between the first BT sheet 117 and the second BT sheet 128, producing beads 132 of adhesive material around the inside corners of the cavities 135.

According to an embodiment, the pressure applied to laminate the first and second BT sheets together is between 5 kg/cm$^2$ and 30 kg/cm$^2$. According to another embodiment, the pressure applied to laminate the first and second BT sheets together is between 10 kg/cm$^2$ and 20 kg/cm$^2$. According to another embodiment, the pressure applied to laminate the first and second BT sheets together is between 16 kg/cm$^2$ and 18 kg/cm$^2$.

According to an embodiment, the adhesive film layer 112 has a thickness of between 15 μm and 100 μm. According to another embodiment, the adhesive film layer 112 has a thickness of between 20 μm and 50 μm. According to an embodiment, the adhesive film layer 112 has a thickness of 25 μm.

The adhesive film layer 112 is preferably a thermosetting adhesive such as is known in the art, and is cured under heat or a combination of heat and pressure. According to an embodiment, the adhesive film layer 112 is cured while the laminating pressure is applied, by the application of heat. According to another embodiment, following the process steps described with reference to FIG. 5, the assembly 133 is heated in an oven to a prescribed temperature to cure the adhesive film layer 112.

According to an embodiment, the material of the first and second BT sheets 117, 128 is initially only partially cured, in which case, the process employed to cure the adhesive film layer 112 also cures the first and second BT sheets.

Figure 6:
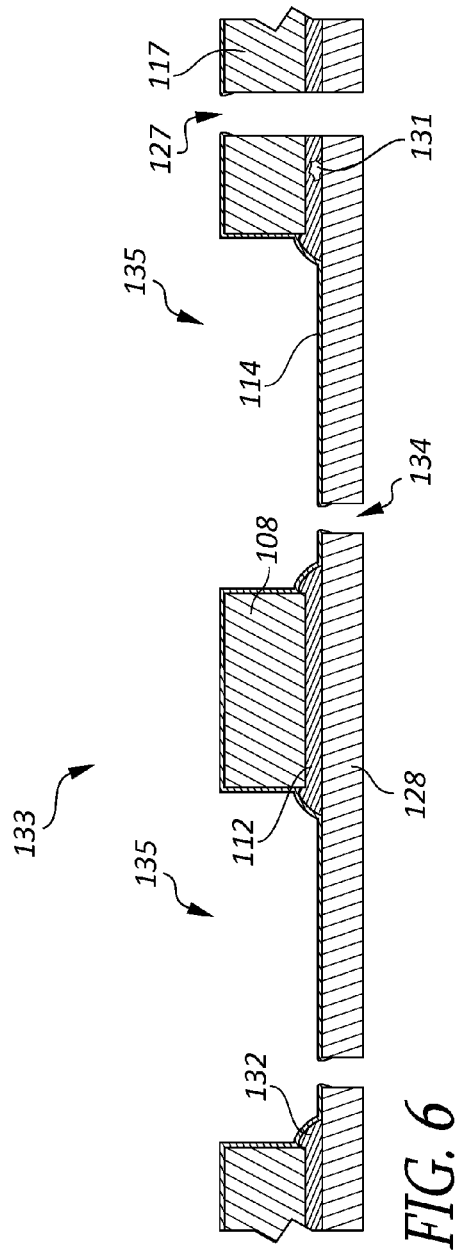

Turning now to FIG. 6, a coating of electrically conductive paint 114 is applied to one side of the assembly 133 so that the conductive paint coats the first face 121 of the first BT sheet 117, side walls 136 of the cavities 135, and exposed portions of the first face 129 of the second BT sheet 128. The paint 114 is formulated to adhere to the BT material of the first and second BT sheets, and also to the material of the adhesive film layer 112, and so forms an electrically conductive layer of paint over the interiors of the cavities 135, extending over the beads 132 of adhesive and also over the remaining portions of the first face 121 of the first BT sheet 117.

According to an embodiment, the paint is sprayed onto the assembly 133. The inventors were concerned that a coat of paint that was sufficiently thick to act as an EMI shield would cover or block very small features such as, e.g., the apertures 134. However, the inventors determined that the paint can be applied in thin coats until an acceptable conductivity is achieved while preserving features like the apertures 134.

The conductive paint 114 is cured, and then, as shown in FIG. 7, the assembly 133 is cut into individual EMI shield caps 102, each comprising a portion of the first BT sheet 117 forming a first BT layer 108, and a portion of the second BT sheet 128 that forms a second BT layer 110. Each shield cap 102 includes a cavity 135, a first face 138, and an electrically continuous layer of conductive paint 114 extending over the side and back walls of the cavity and onto the first face. Because the conductive paint is applied to the assembly before being cut into individual shield caps, there is no conductive layer on the outsides of the shield caps 102. The term continuous is used to mean that there are no portions of the layer of paint 114 within the cavity 135 that are electrically isolated from the remainder of the layer.

According to an embodiment, the shield caps 102 are installed over MEMS devices as described hereafter with reference to FIG. 8. One or more MEMS devices 106 are first manufactured according to known principles, and mounted to a substrate 104. In the example shown in FIG. 8, the MEMS device 106 is a microphone in a flip-chip configuration and the substrate 104 includes the appropriate contact pads and an electrical wiring circuit configured to electrically couple the MEMS device as a component of another circuit. The substrate 104 also includes a layer 118 of conductive material that is electrically coupled to a circuit ground and patterned to receive the EMI shield cap 102.

Depending upon the requirements of the particular application, the layer 118 can be patterned to be coupled around the entire first face 138 of the shield cap 102, or, alternatively, can be in the form of contact pads that make contact with the shield cap over a smaller portion of the first face 138. The substrate 104 can also include a conductive ground plane coupled to the circuit ground and positioned to shield the MEMS device from below.

Conductive adhesive 116 is positioned on the substrate 104 and the EMI shield caps 102 are pressed onto the conductive adhesive, typically in a pick-and-place operation. The conductive adhesive 116 is cured, after which the substrate is cut into individual shielded MEMS packages 100, as shown in FIG. 2.

According to an alternate embodiment, a single sheet of BT material is machined to form a plurality of cavities in one face, after which, the sheet is processed as described above, beginning with the steps described with reference to FIG. 6. The machining process can be a routing process similar that described above, or any process that can produce the cavities of the size and depth desired for a given application. By forming cavities in a single sheet, it is not necessary to laminate two or more sheets to form the cavities, which obviates the associated steps.

The second BT sheet 128 and shield caps 102 are shown in the drawings as including apertures 134. These are specific to an EMI shield cap intended for use with a MEMS microphone, and are merely exemplary. The shape and particular configuration of the shield cap, including features such as the apertures 134, etc., are selected according to the intended end use of the shield cap, and are well understood in the art.

The first and second BT sheets 117, 128 are shown as each having a single layer of BT material. According to other embodiments, either sheet or both sheets can comprises a plurality of layers. For example, according to an embodiment in which the device to be shielded requires a shield cap having a cavity with a depth that exceeds the thickness of a single layer of BT material, the first sheet 117 comprises a number of layers sufficient to meet or exceed the minimum cavity depth. Additionally, because the disclosed process does not require plating, copper layers, such as described with reference to the shield cap 50 of the prior art, are not necessary. However, BT sheets with copper layers can be used if desired. For example, a layer of copper under the paint, at least on the horizontal surfaces of a shield cap, may improve the conductivity of the paint layer.

In tests conducted by the inventors, a number of shield caps were made, substantially as described above, to evaluate their effectiveness in overcoming the problems outlined above. An adhesive film having a thickness of 25 µm was used, and subjected to a 1 laminating pressure of 16.6 kg/cm$^2$. Two thin coats of conductive paint were applied. The test shield caps were found to provide adequate electromagnetic shielding, tolerated multiple thermal cycles at reflow temperatures, and to meet or exceed standards in mechanical strength and rigidity. No delamination was found to occur.

BT is a class of resin that is very widely used in printed circuit boards and various semiconductor packaging applications because BT can be formulated to have a very high glass transition temperature and a very low dielectric constant. Both of these qualities are desirable in the semiconductor industry. Accordingly, embodiments are described as being made from BT material. However, the claims are not limited to BT material except where such limitation is explicit. The selection of material is a design consideration, and may depend on a number of factors, including the particular intended end use, availability and cost, etc. Alternative materials can include polyimide resin, epoxy resin, polyphenylether resin, etc.

In describing the embodiments illustrated in the drawings, directional references, such as right, left, top, bottom, etc., are used to refer to elements or movements as they are shown in the figures. Such terms are used to simplify the description and are not to be construed as limiting the claims in any way.

The term coupled, as used in the claims, includes within its scope indirect coupling, such as when two elements are coupled with one or more intervening elements even where no intervening elements are recited.

The unit symbol "µm" is used herein to refer to a value in microns. One micron is equal to $1 \times 10^{-6}$ meters.

The abstract of the present disclosure is provided as a brief outline of some of the principles of the invention according to one embodiment, and is not intended as a complete or definitive description of any embodiment thereof, nor should it be relied upon to define terms used in the specification or claims. The abstract does not limit the scope of the claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a first layer of polymeric material having a first face and a second face, opposite the first face;
an aperture extending through the first layer from the first face to the second face;
a second layer of polymeric material positioned on the first face of the first layer and covering the aperture to form a cavity, the cavity having side walls formed by the aperture of the first layer and a back wall formed by a surface of the second layer;
a layer of adhesive coupling the first layer and the second layer together, the layer of adhesive having a first thickness; and
an electrically continuous layer of conductive paint located in the cavity and extending on the side walls and back wall of the cavity and on the adhesive layer, the layer of conductive paint having a second thickness that is substantially smaller than the first thickness, the layer of conductive paint assisting in adhering the first layer and the second layer together.

2. The device of claim 1 wherein the polymeric material of the first and second layers is Bismaleimide Triazine Resin.

3. The device of claim 1 wherein a portion of the layer of adhesive extends from between the first and second layers and forms a bead around the back wall of the cavity, and wherein the layer of conductive paint extends over the bead of adhesive.

4. The device of claim 1, comprising:
a package substrate mechanically coupled to the face of the body;
a wiring circuit in the package substrate and having a circuit ground electrically coupled to the conductive paint extending on the face of the body;
a microelectromechanical systems device coupled to a face of the package substrate inside the cavity.

5. The device of claim 4, comprising:
a conductive land on the face of the package substrate, in electrical contact with the circuit ground of the wiring circuit, and in a position corresponding to the face of the body; and
conductive adhesive positioned between the conductive land and the face of the body and electrically coupling the conductive paint extending on the face of the body and the conductive land.

6. The device of claim 1 wherein the adhesive layer directly couples the first layer and the second layer together.

7. The device of claim 6 wherein the adhesive layer is a single layer of adhesive material.

8. A Method of manufacture, comprising:
positioning a layer of adhesive on a first face of a first sheet of polymeric material, the layer of adhesive having a first thickness;
forming a plurality of apertures extending through the first sheet of polymeric material and through the layer of adhesive;
positioning a second sheet of polymeric material on the first face of the first sheet of polymeric material in contact with the layer of adhesive, closing one side of the plurality of apertures and forming a plurality of cavities; and
depositing a layer of electrically conductive paint over the second face of the first sheet of polymeric material, over side walls and end walls of the plurality of cavities, and over an exposed portion of the layer of adhesive, the layer of electrically conductive paint having a second thickness that is substantially thinner than the first thickness, the layer of electrically conductive paint assisting in adhering the first and sheets of polymeric material together.

9. The method of claim 8 wherein positioning the second sheet of polymeric material on the first face of the first sheet of polymeric material comprises applying compressive force between the first and second sheets.

10. The method of claim 9 wherein the applying compressive force comprises applying a compressive force of more than 10 kg/cm$^2$ and less than 20 kg/cm$^2$.

11. The method of claim 9 wherein the applying compressive force comprises forming a bead of adhesive around the back walls of the plurality of cavities, and wherein the depositing the layer of electrically conductive paint comprises depositing the conductive paint over the beads of adhesive.

12. The method of claim 8 wherein the positioning a layer of adhesive comprises positioning a layer of adhesive film that includes a protective liner.

13. The method of claim 8 wherein the positioning a layer of adhesive comprises positioning a layer of adhesive having a thickness of more than 20 µm and less than 30 µm.

14. A method, comprising:
forming an aperture in a first sheet of polymeric material;
using an adhesive layer to couple a second sheet of polymeric material to a face of the first sheet and covering one side of the aperture, thereby forming a cavity, the adhesive layer having a first thickness; and
applying an electrically continuous layer of conductive paint to side and back walls of the cavity, to the adhesive layer, and to the face of the body, the layer of conductive paint having a second thickness that is substantially thinner than the first thickness of the adhesive layer, the layer of conductive paint assisting is coupling the first and second sheets of polymeric material together.

15. The method of claim 14, wherein using an adhesive layer comprises forming an adhesive layer directly on one of the first or second sheets of material and coupling the first and second sheets together.

16. The method of claim 14 wherein:
forming the aperture in the first sheet of polymeric material comprises forming a plurality of apertures in the first sheet of polymeric material;
using the adhesive layer to couple the second sheet of polymeric material to the face of the first sheet comprises using the adhesive layer to couple the second sheet of polymeric material to the face of the first sheet and covering one side of the plurality of apertures, thereby forming a plurality of cavities; and
applying the electrically continuous layer comprises applying an electrically continuous layer of conductive paint to side and back walls of each of the plurality of cavities, and to the face of the body.

* * * * *

UNITED STATES PATENT AND TRADEMARK OFFICE
CERTIFICATE OF CORRECTION

| | | |
|---|---|---|
| PATENT NO. | : 8,987,871 B2 | Page 1 of 1 |
| APPLICATION NO. | : 13/485631 | |
| DATED | : March 24, 2015 | |
| INVENTOR(S) | : Jerome Teysseyre et al. | |

It is certified that error appears in the above-identified patent and that said Letters Patent is hereby corrected as shown below:

In the Claims

Column 7, Line 40:
"paint extending on the face of the body;" should read, --paint extending on the face of the body; and--.

Column 7, Line 56:
"8. A Method of manufacture, comprising:" should read, --8. A method of manufacture, comprising:--.

Column 8, Line 11:
"in adhering the first and sheets of polymeric material" should read, --in adhering the first and second sheets of polymeric material--.

Signed and Sealed this
Twenty-ninth Day of September, 2015

Michelle K. Lee
*Director of the United States Patent and Trademark Office*